US011551949B2

United States Patent
Tanino (10) Patent No.: US 11,551,949 B2
(45) Date of Patent: Jan. 10, 2023

(54) SUBSTRATE PROCESSING DEVICE

(71) Applicant: Kioxia Corporation, Minato-ku (JP)

(72) Inventor: Hirohito Tanino, Suzuka (JP)

(73) Assignee: Kioxia Corporation, Minato-ku (JP)

( * ) Notice: Subject to any disclaimer, the term of this patent is extended or adjusted under 35 U.S.C. 154(b) by 180 days.

(21) Appl. No.: 16/937,013

(22) Filed: Jul. 23, 2020

(65) Prior Publication Data

US 2021/0074555 A1 Mar. 11, 2021

(30) Foreign Application Priority Data

Sep. 10, 2019 (JP) .............................. JP2019-164253

(51) Int. Cl.
*H01L 21/67* (2006.01)
*H01L 21/027* (2006.01)
*H01L 21/311* (2006.01)
*H01L 21/3213* (2006.01)
*B29C 45/14* (2006.01)
*G03F 7/16* (2006.01)
*B29C 45/76* (2006.01)
*B29L 31/34* (2006.01)

(52) U.S. Cl.
CPC .... *H01L 21/6715* (2013.01); *B29C 45/14336* (2013.01); *B29C 45/76* (2013.01); *G03F 7/16* (2013.01); *H01L 21/0274* (2013.01); *H01L 21/31111* (2013.01); *H01L 21/31116* (2013.01); *H01L 21/31144* (2013.01); *H01L 21/32134* (2013.01); *H01L 21/32136* (2013.01); *H01L 21/32139* (2013.01); *B29C 2945/76096* (2013.01); *B29L 2031/3406* (2013.01)

(58) Field of Classification Search
CPC ........... H01L 21/6715; H01L 21/67126; H01L 21/67259; B29C 45/14336; G03F 7/16
See application file for complete search history.

(56) References Cited

U.S. PATENT DOCUMENTS

| 7,935,217 B2 | 5/2011 | Yashiki et al. |
| 9,690,202 B2 | 6/2017 | Terashita et al. |
| 2002/0124797 A1* | 9/2002 | Kitano ................ H01L 21/6715 |
| | | 118/213 |

FOREIGN PATENT DOCUMENTS

| JP | 11-10055 A | 1/1999 |
| JP | 2005-217282 A | 8/2005 |
| JP | 2006-102640 A | 4/2006 |
| JP | 4601452 B2 | 12/2010 |
| JP | 2016-058712 A | 4/2016 |
| WO | WO 2018/207672 A1 | 11/2018 |

* cited by examiner

*Primary Examiner* — Syed I Gheyas
(74) *Attorney, Agent, or Firm* — Oblon, McClelland, Maier & Neustadt, L.L.P.

(57) ABSTRACT

According to one embodiment, a substrate processing device includes a stage configured to mount a substrate, a mold having a first surface facing an upper surface of an outer peripheral edge of the substrate and a second surface facing a side surface of an outer peripheral continuous with the upper surface of the outer peripheral edge, a mold moving mechanism configured to move the mold to bring the first surface close to the upper surface of the outer peripheral edge of the substrate and the second surface close to the side surface of the outer peripheral of the substrate, and a nozzle arranged in the mold, wherein the nozzle ejects resist.

11 Claims, 13 Drawing Sheets

SUBSTRATE PROCESSING DEVICE

CROSS REFERENCES TO RELATED APPLICATION(S)

This application is based upon and claims the benefit of priority from the prior Japanese Patent Application No. 2019-164253, filed on Sep. 10, 2019, the entire contents of which are incorporated herein by reference.

FIELD

Embodiments described herein relate generally to a substrate processing device.

BACKGROUND

In the process of manufacturing a semiconductor device, a plurality of layers of a thin film is formed on a semiconductor wafer, a patterned resist is formed thereon, and the thin film is etched by reactive ion etching using the resist as a mask. The thin film exposed by such reactive ion etching may be further subjected to wet etching.

DESCRIPTION OF EMBODIMENTS

A substrate processing device according to one embodiment of the present invention includes: a stage configured to mount a substrate, a mold having a first surface facing an upper surface of an outer peripheral edge of the substrate and a second surface facing a side surface of an outer peripheral continuous with the upper surface of the outer peripheral edge, a mold moving mechanism configured to move the mold to bring the first surface close to the upper surface of the outer peripheral edge of the substrate and the second surface close to the side surface of the outer peripheral of the substrate, and a nozzle arranged in the mold, wherein the nozzle ejects resist.

Hereinafter, a substrate processing device according to the present embodiment will be described in detail by referring to the drawings. In the following description, constituent elements having substantially the same functions and configurations are denoted by the same reference numerals, and duplicate description will be given only when necessary. Each of the embodiments described below exemplifies a device and a method for embodying the technical idea of this embodiment, and the technical idea of the embodiment does not specify the material, shape, structure, arrangement, and the like of the component parts as follows. Various modifications can be made to the technical idea of the embodiment in the claims.

In order to make the description clearer, the drawings may be schematically represented with respect to widths, thicknesses, shapes, and the like of the respective portions in comparison with actual embodiments, but are merely an example and do not intended to limit the interpretation of the present invention. In the specification and each drawing, elements having the same functions as those described with reference to the preceding figures are denoted by the same reference numerals, and a repetitive description thereof may be omitted.

[Configuration of a Substrate Processing Device According to the First Embodiment]

Figure 1A:
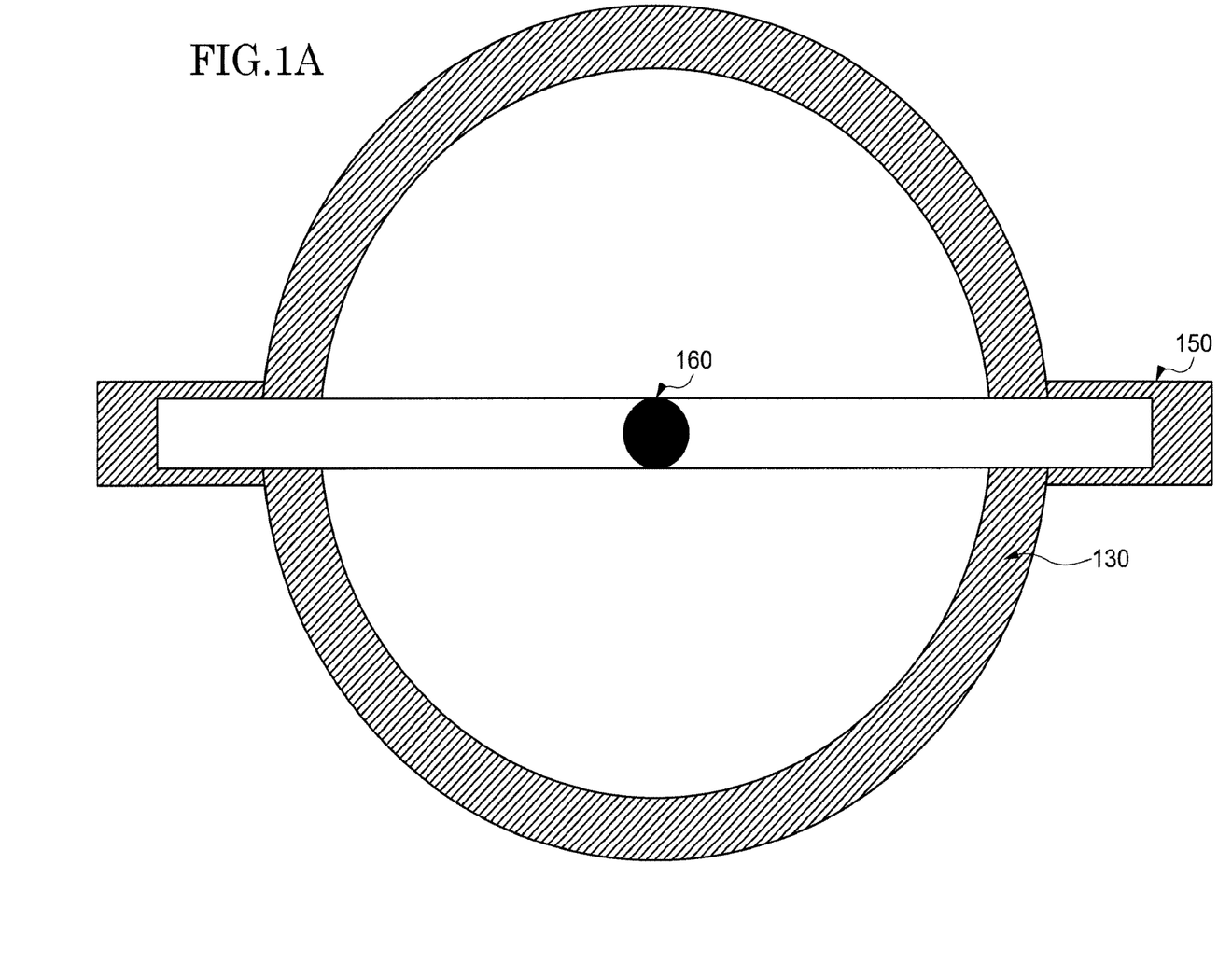
FIG. 1A is a plan view of a substrate processing device according to the first embodiment.
Figure 1B:
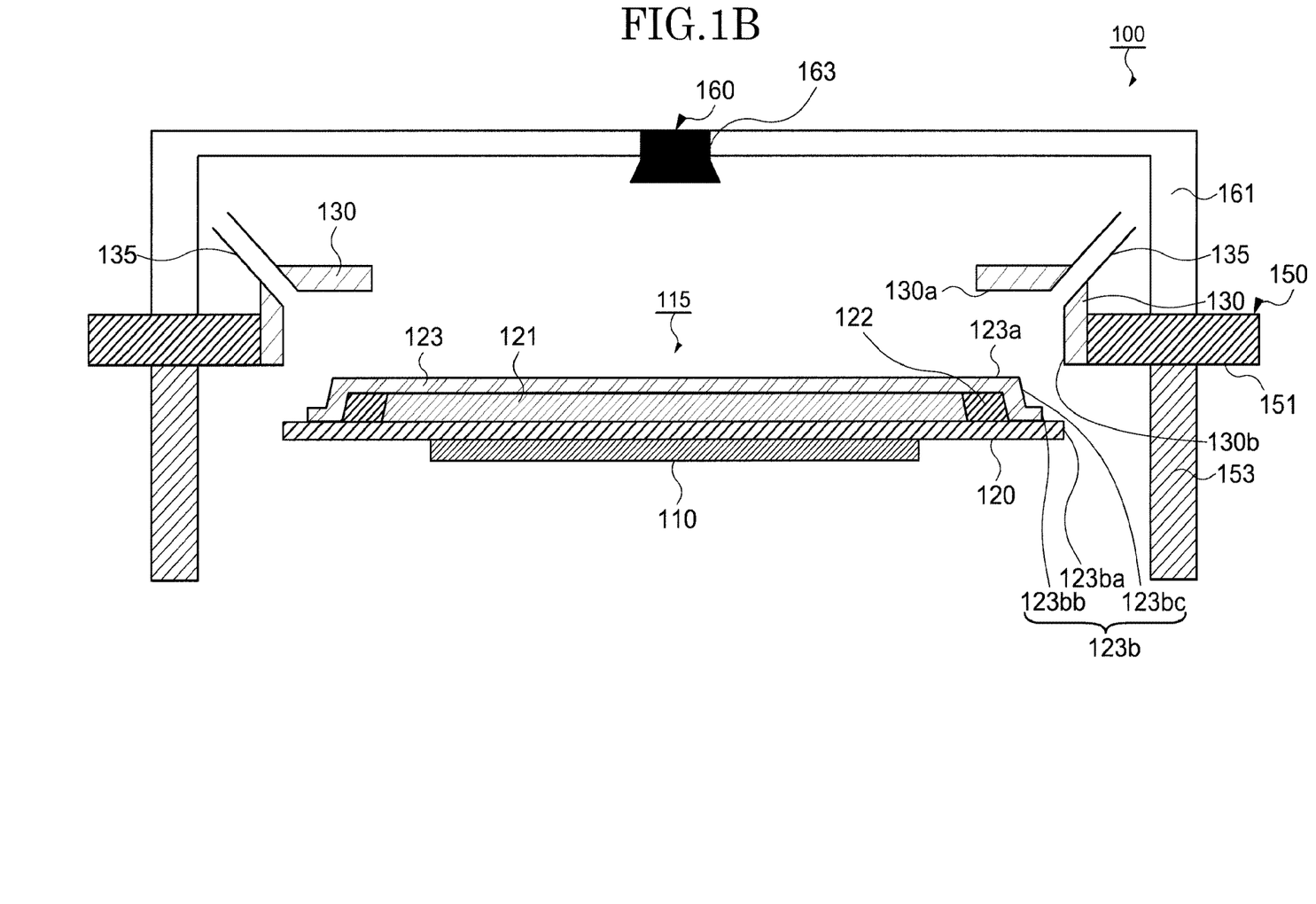
FIG. 1B is a cross-sectional view of a substrate processing device according to the first embodiment.

The configuration of a substrate processing device according to the first embodiment of the present invention will be described with reference to FIGS. 1A and 1B.

A substrate processing device 100 according to the first embodiment of the present invention includes a stage (substrate mounting unit) 110 for mounting a semiconductor substrate 115, a mold 130, a mold moving mechanism 150, and height detection mechanism 160.

The semiconductor substrate 115 is, for example, a three-dimensional stacked layer type semiconductor memory. The semiconductor substrate 115 includes a silicon single crystal substrate 120 as a base, a stacked portion 121 having a high height in the vertical direction, and a filling portion 122 having a high height in the vertical direction, which is filled with a TEOS (tetraethyl orthosilicate) film adjacent to the stacked portion 121 and located in the peripheral of the silicon single crystal substrate 120. The stacked portion 121 is, for example, a memory cell unit in which many tungsten wiring layers (which functions as a word line) and a silicon dioxide layers (which functions as an insulating layer between the word lines vertically adjacent to each other) are alternately stacked.

When selectively removing these films by etching, at first, a hard mask 123 is formed to cover the silicon single crystal substrate 120, the stacked portion 121, and the filling portion 122. The hard mask 123 is, for example, an amorphous carbon film that can be peeled off. As will be described later, after the outer peripheral edge of the substrate is protected, a resist material is applied on the hard mask 123. Next, the resist is selectively irradiated with UV rays or other energies by an exposure device to expose a resist pattern. Further, using the resist pattern formed after development as the mask, for example, a memory hole or the like is processed.

A step is formed at the outer peripheral edge of the hard mask 123. A side surface 123*bc* of the hard mask 123 formed along the side surface of the filling portion 122 forms a first step. A side surface 123*bb* formed at the terminal of the hard mask 123 extended on the silicon single crystal substrate 120, forms a second step. The silicon single crystal substrate 120 also has a side surface 123*ba* of the outer peripheral. These side surfaces of the side surfaces 123*ba* of the outer peripheral, the side surface 123*bb* and the side surface 123*bc* are also a side surface 123*b* of the outer peripheral of the semiconductor substrate 115.

The substrate processing device 100 according to the first embodiment of the present invention includes the stage 110 for mounting the semiconductor substrate 115. The stage 110 is provided with an electrostatic chuck or a vacuum chuck to fix the semiconductor substrate 115. The stage incorporates a heater for curing the resist, which will be described later.

The substrate processing device 100 according to the first embodiment of the present invention includes the mold 130. The mold 130 is matched to the shape of the semiconductor substrate 115, and if the semiconductor substrate 115 is disk-shaped, the mold 130 is ring-shaped. The mold 130 includes a ring-shaped flat surface portion 130*a* and a ring-shaped vertical portion 130*b*. The mold 130 is in a raised position when the semiconductor substrate 115 is carried in and out. When the semiconductor substrate 115 is carried in, the mold 130 is lowered. When the mold 130 is moved to a position enclosing the semiconductor substrate 115, an upper surface 123*a* of the outer peripheral edge of the semiconductor substrate 115 and the flat surface portion 130*a* are closely faced each other. The side surface 123*b* of the outer peripheral continuous with the upper surface 123*a* of the outer peripheral edge and the vertical portion 130*b* are closely faced each other.

A nozzle 135 for ejecting resists is formed on a region of the mold 130 that connects the flat surface portion 130*a* and the vertical portion 130*b*. The nozzle 135 is connected to a resist supply device (not shown). The plurality of nozzle 135 is provided at a plurality of locations on the ring-shaped mold 130, for example, are provided at 12 locations every 30° in rotational symmetry.

The substrate processing device 100 according to the first embodiment of the present invention includes the mold moving mechanism 150 that moves the mold 130. The mold moving mechanism 150 includes a mold holding member 151 and a pin 153. In this embodiment, the mold holding member 151 is connected to the outside of the vertical portion 130*b* of the mold 130 to hold the mold 130 in the substrate processing device 100. However, the present invention is not limited thereto, and the mold holding member 151 may be connected to the outside of the flat surface portion 130*a* of the mold 130 to hold the mold 130 in the substrate processing device 100. The mold holding member 151 is connected to the pin 153. The pin 153 can move the mold holding member 151 up and down with respect to the stage 110 in the vertical direction by a driving mechanism (not shown). The drive source may be, for example, hydraulic pressure or pneumatic pressure.

The substrate processing device 100 according to the first embodiment of the present invention includes the height detection mechanism 160 that detects the distance between the mold 130 and the semiconductor substrate 115. The height detection mechanism 160 according to this embodiment includes a fixing member 161 and a distance measuring device 163. The fixing member 161 fixes the distance measuring device 163 to the mold holding member 151. However, the present invention is not limited thereto, and the fixing member 161 may directly fix the distance measuring device 163 to the mold 130. With this configuration, the distance between the distance measuring device 163 and the mold 130 can be fixed. The distance measuring device 163 measures the distance between the distance measuring device 163 and the semiconductor substrate 115 mounted on the stage 110. The distance between the semiconductor substrate 115 and the mold 130 can be calculated by subtracting the distance between the distance measuring device 163 and the mold 130 from the measured value of the distance measuring device 163. The distance measuring device 163 may be, for example, an optical type sensor or a laser type sensor.

[Operation of the Substrate Processing Device According to the First Embodiment]

The operation of the substrate processing device according to the first embodiment of the present invention will be described with reference to FIGS. 2 to 7. In FIGS. 3 to 7, the mold moving mechanism 150 and the height detecting mechanism 160 are omitted in order to more clearly show the relationship between the mold 130 and the semiconductor substrate 115.

Figure 2:
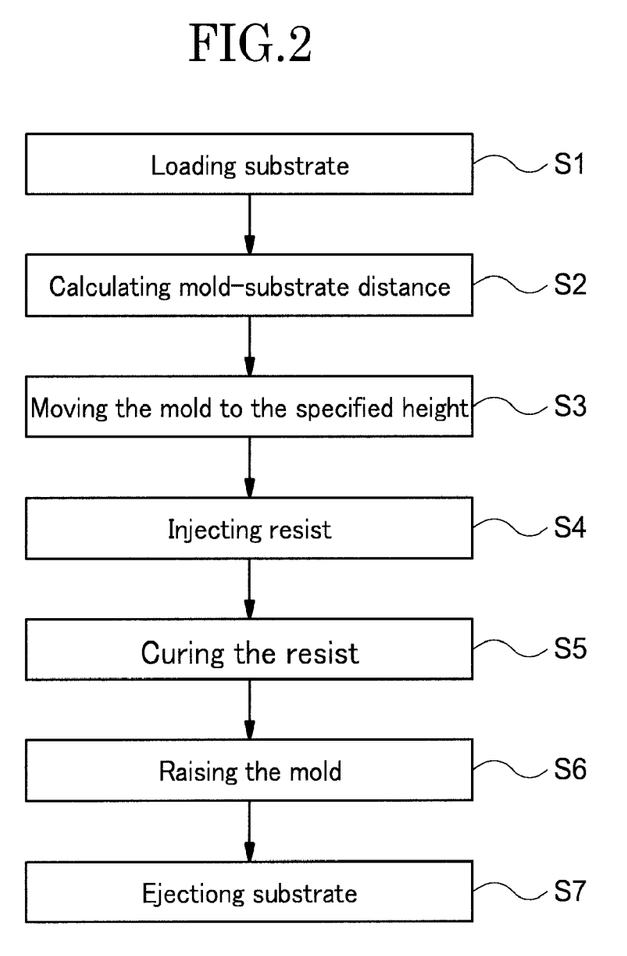
FIG. 2 is a flowchart showing an operation of a substrate processing device according to the first embodiment.
Figure 3:
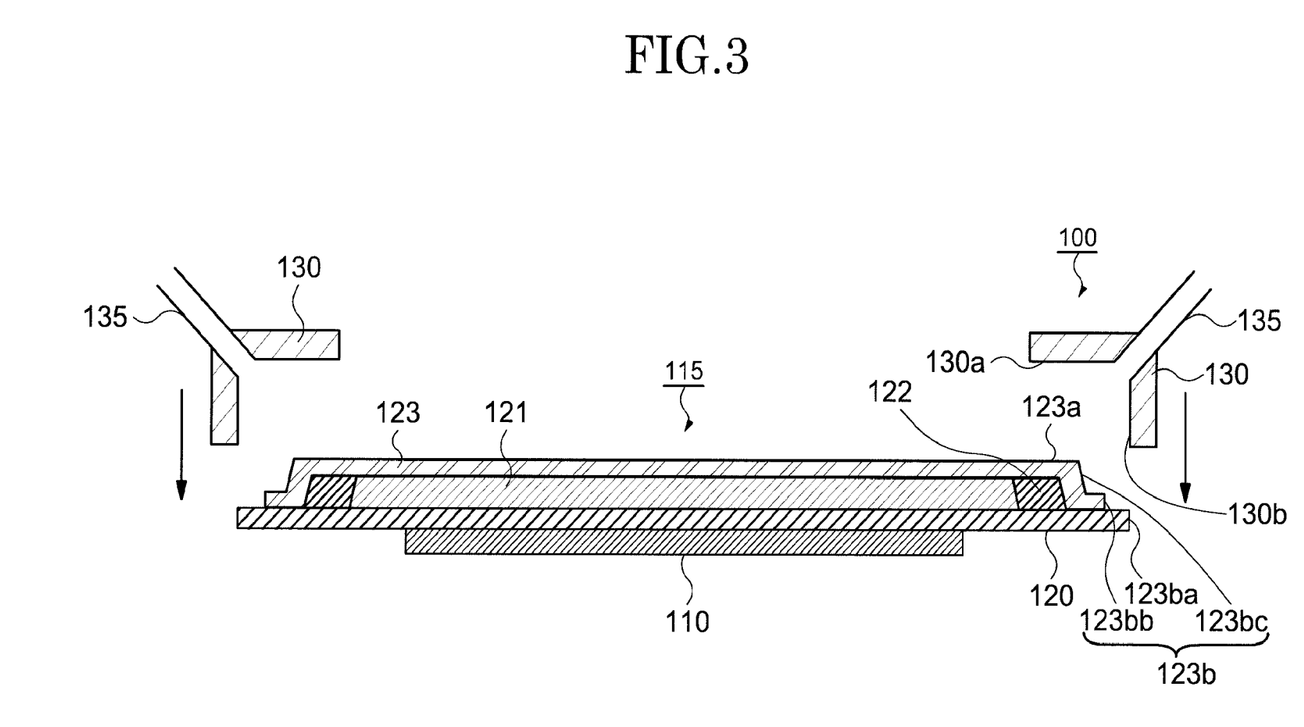
FIG. 3 is a cross-sectional view showing an operation of a substrate processing device according to the first embodiment.

As shown in FIG. 2, when the semiconductor substrate 115 is loaded into the substrate processing device 100 (FIG. 2 S1), the height detection mechanism 160 calculates the distance between the mold 130 and the semiconductor substrate 115 (FIG. 2 S2). The distance between the mold 130 and the semiconductor substrate 115 may be, for example, the distance between the flat surface portion 130*a* of the mold 130 and the upper surface 123*a* of the outer peripheral edge of the semiconductor substrate 115. As shown in FIG. 3, the mold moving mechanism 150 lowers the mold 130 toward the semiconductor substrate 115 to a specified height (FIG. 2 S3).

Figure 4:
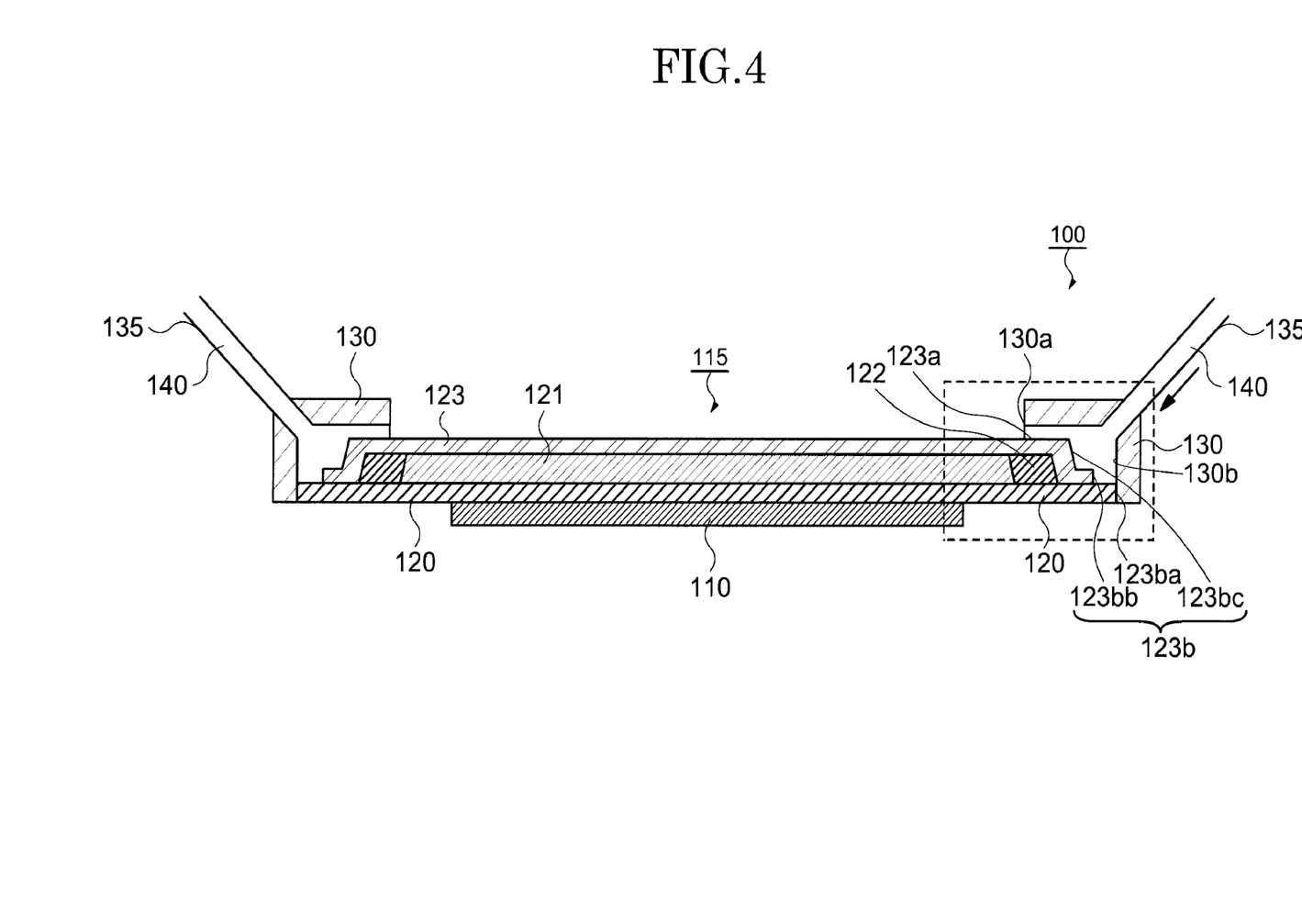
FIG. 4 is a cross-sectional view showing an operation of a substrate processing device according to the first embodiment.

The mold moving mechanism 150 lowers the mold 130 to a position (specified height) where the upper surface 123*a* of the outer peripheral edge of the semiconductor substrate 115 and the flat surface portion 130*a* are closely faced each other, and the side surface 123*b* of the outer peripheral continuous with the upper surface 123*a* of the outer peripheral edge and the vertical portion 130*b* are closely faced each other. As shown in FIG. 4, the thermosetting resist 140 is injected through the nozzle 135 in the position where the mold 130 is lowered toward the semiconductor substrate 115 to the specified height (FIG. 2 S4).

Figure 5:
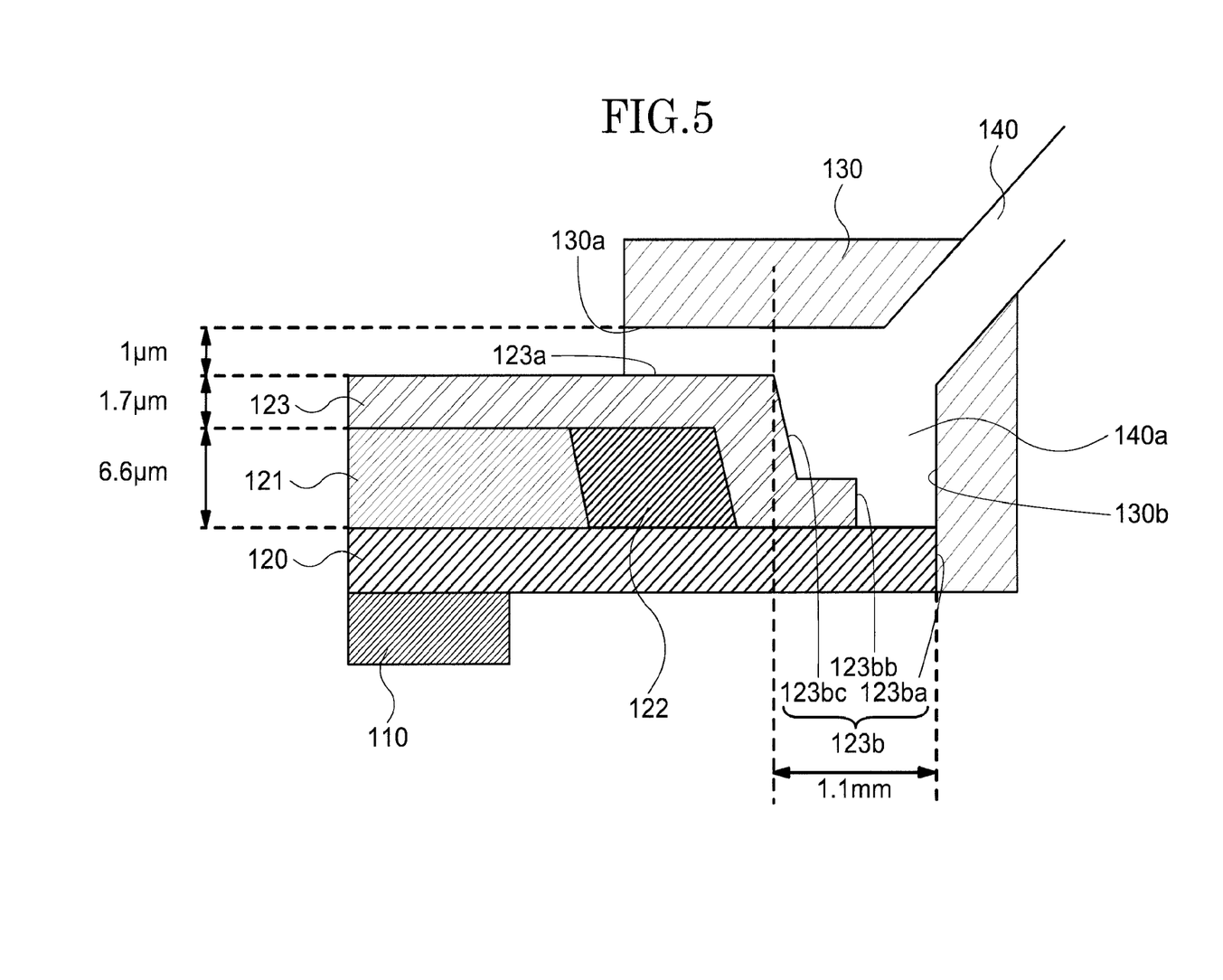
FIG. 5 is an enlarged view of a region surrounded by a dotted line in FIG. 4.

FIG. 5 is an enlarged view of the dotted line portion of FIG. 4. When the mold 130 is lowered to the specified height, only a slight gap is formed that is approximately in contact with the side surface 123*ba* of the outer peripheral of the silicon single crystal substrate 120 and the vertical portion 130*b* of the mold 130. On the other hand, the highest portion of the upper surface 123*a* of the outer peripheral edge of the hard mask 123 and the flat surface portion 130*a* of the mold 130 are spaced apart by a predetermined distance. The space formed by an outer peripheral edge of the semiconductor substrate 115 and the mold 130 is filled with the thermosetting resist 140. A slight gap between the highest portion of the upper surface 123*a* of the outer peripheral edge of the hard mask 123 and the flat surface portion 130*a* of the mold 130 is also filled with the thermosetting resist 140.

In FIG. 5, dimensions such as height, thickness, length, and the like are shown as an example. The heights of the stacked portion 121 and the filling portion 122 are, for example, 6.6 µm, and the thickness of the hard mask 123 is, for example, 1.7 µm. The length from the first step to the vertical portion 130*b* is, for example, 1.1 mm. The height of the flat surface portion 130a of the mold 130 and upper surface 123a of the outer peripheral edge of the semiconductor substrate 115 is, for example, 1 μm. That is, the specified height may be, for example, 1 μm. The specified height can be appropriately selected depending on the amount and viscosity of the resist 140 to be injected.

Figure 6:
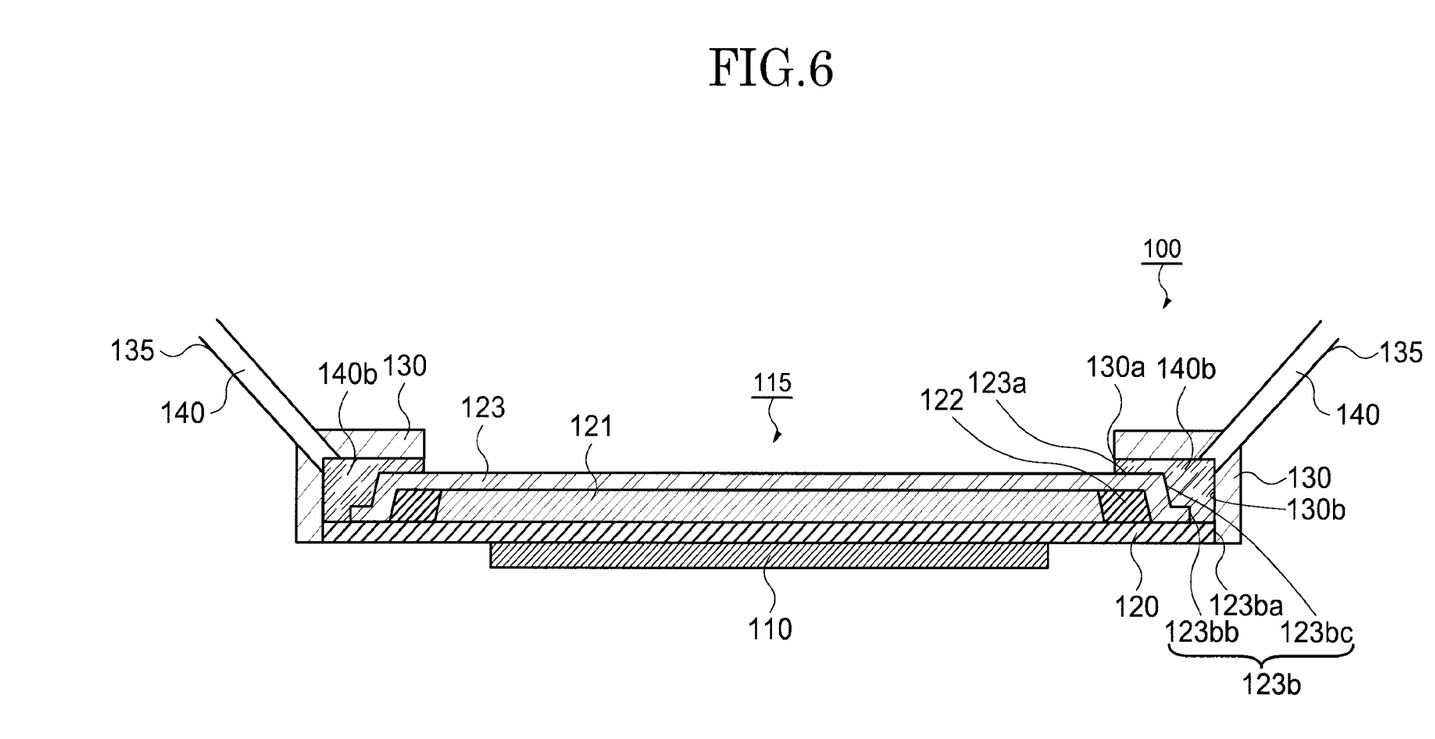
FIG. 6 is a cross-sectional view showing an operation of a substrate processing device according to the first embodiment.

Subsequently, the injected thermosetting resist 140 is cured (FIG. 2 S5) as shown in FIG. 6. The stage 110 incorporates the heater which heats the thermosetting resist 140 to, for example, 130° C. to cure the thermosetting resist 140, thereby forming a protection ring 140b of the outer peripheral edge. The heater is incorporated in the stage 110 far from the nozzle 135 so that the liquid resist 140 in the nozzle 135 is not cured.

Figure 7:
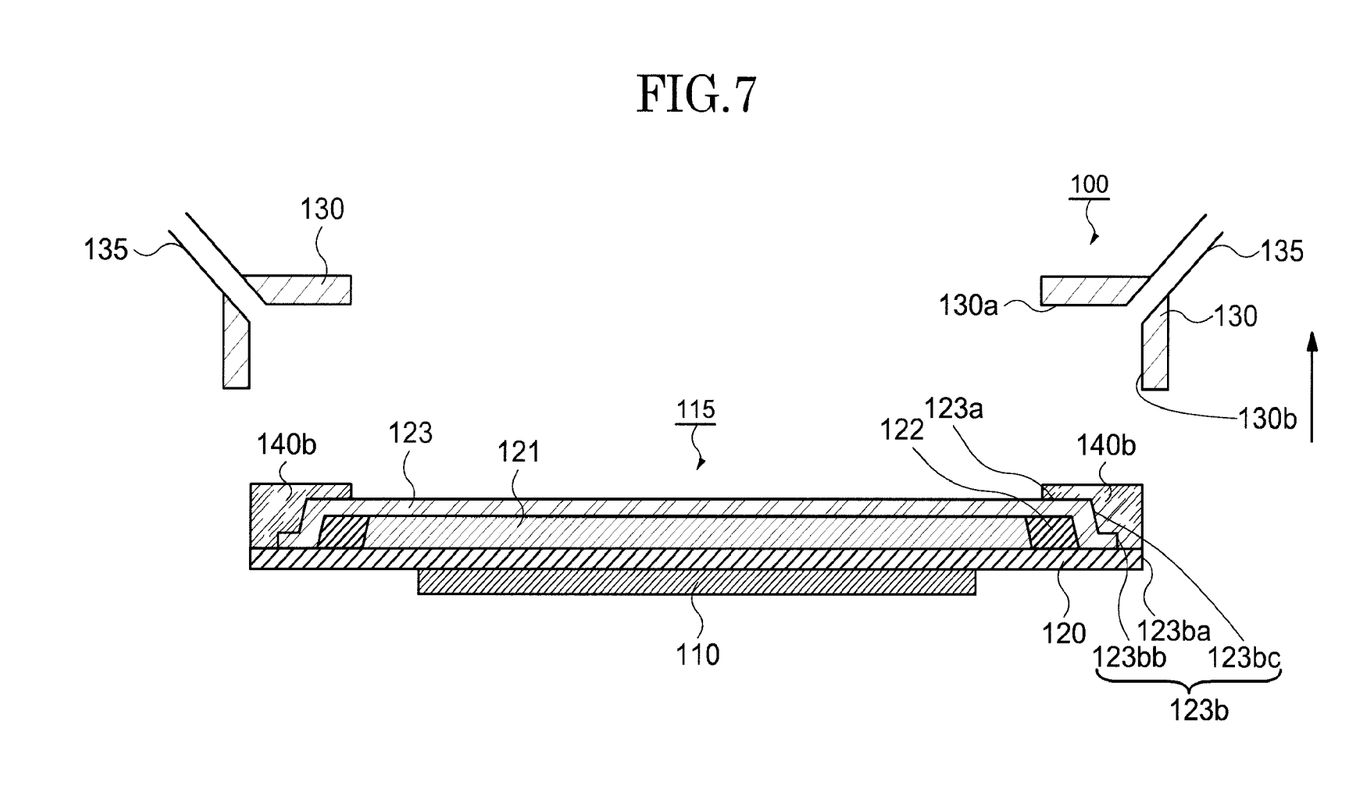
FIG. 7 is a cross-sectional view showing an operation of a substrate processing device according to the first embodiment.

Subsequently, as shown in FIG. 7, after forming the protection ring 140b of the outer peripheral edge on the semiconductor substrate 115, the mold 130 is raised by the mold moving mechanism 250 (FIG. 2 S6). The semiconductor substrate 115 is then ejected from the substrate processing device 100 (FIG. 2 S7).

[Method of Manufacturing a Semiconductor Device Using the Substrate Processing Device According to the First Embodiment]

The method of manufacturing the semiconductor device according to the embodiment of the present invention is as follows. First, as described above, the semiconductor substrate 115 having the step in the outer peripheral edge (the step formed in the hard mask 123) is prepared, this is covered with the mold 130, the upper surface 123a of the outer peripheral edge of the semiconductor substrate 115 and the flat surface portion 130a are closely faced, the side surface 123b of the outer peripheral continuous with the upper surface 123a of the outer peripheral edge and the vertical portion 130b are closely faced each other. Next, the thermosetting resist 140 is injected from the nozzle 135, and the thermosetting resist 140 is cured by the heater incorporated in the stage 110, thereby forming the protection ring 140b of the outer peripheral edge on the semiconductor substrate 115.

Subsequently, a resist material is applied on the hard mask 123. Next, the resist material is selectively irradiated with energies such as UV rays by the exposure device to expose the resist pattern. Further, using the resist pattern formed after development as the mask, for example, the memory hole or the like is processed.

In this way, even when etching a thin film having a large step on the semiconductor substrate, thinning (thinned film) does not occur due to the presence of the protection ring 140b of the outer peripheral edge. Therefore, the resist is not penetrated by the reactive ion etching process, and the substrate is not damaged by the subsequent wet etching process.

[Configuration of the Substrate Processing Device According to the Second Embodiment]

Figure 8:
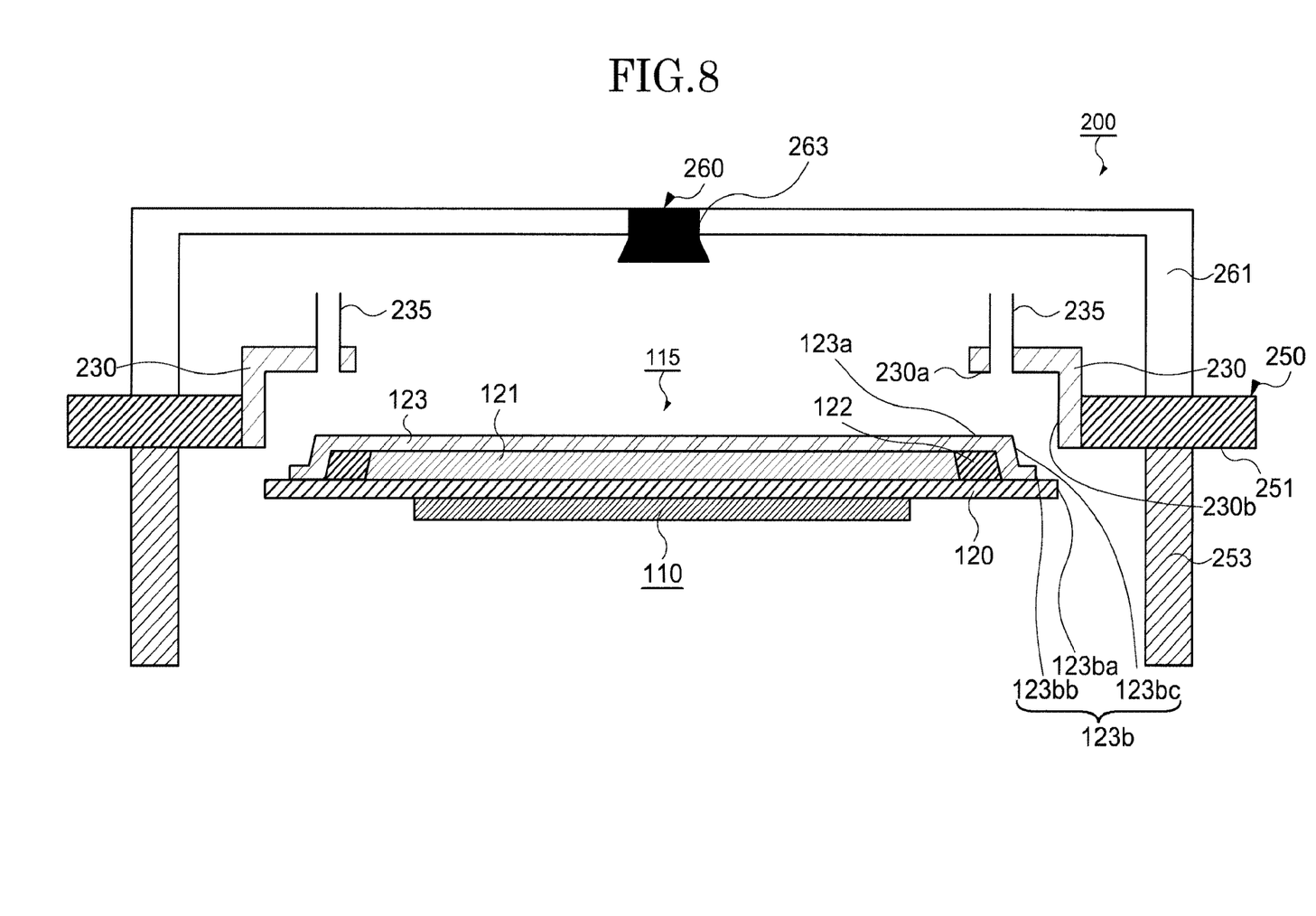
FIG. 8 is a cross-sectional view of a substrate processing device according to the second embodiment.

The configuration of the substrate processing device according to the second embodiment of the present invention will be described with reference to FIG. 8.

A substrate processing device 200 according to the second embodiment of the present invention includes the stage 110 for mounting the semiconductor substrate 115, a mold 230, and the mold moving mechanism 250, and height detection mechanism 260.

The semiconductor substrate 115, as described in the first embodiment, for example, the three-dimensional stacked layer type semiconductor memory. The hard mask 123 is formed to cover the silicon single crystal substrate 120, the stacked portion 121, and the filling portion 122.

A step formed in the outer peripheral edge portion of the semiconductor substrate 115 of the hard mask 123, the side surface 123ba of the outer peripheral, the side surface 123bb and the side surface 123bc are also as described above in that the side surface 123b of the outer peripheral of the semiconductor substrate 115.

The substrate processing device 200 according to the second embodiment of the present invention includes the stage 110 for mounting the semiconductor substrate 115. The stage 110 is provided with the electrostatic chuck or the vacuum chuck to fix the semiconductor substrate 115. The stage incorporates the heater for curing the resist.

The substrate processing device 200 according to the second embodiment of the present invention includes the mold 230. The mold 230 is also matched to the shape of the semiconductor substrate 115, and if the semiconductor substrate 115 is disk-shaped, the mold 230 is ring-shaped. The mold 230 includes a ring-shaped flat surface portion 230a and a ring-shaped vertical portion 230b. The mold 230 is in the raised position when the semiconductor substrate 115 is carried in and out. When the semiconductor substrate 115 is carried in, the mold 230 is lowered. When the mold 230 is moved to a position enclosing the semiconductor substrate 115, the upper surface 123a of the outer peripheral edge of the semiconductor substrate 115 and the flat surface portion 230a are closely faced each other. The side surface 123b of the outer peripheral continuous with the upper surface 123a of the outer peripheral edge and the vertical portion 230b are closely faced each other.

A nozzle 235 for dropping the resist is formed on the flat surface portion 230a of the mold 230. The nozzle 235 is connected to the resist supply device (not shown). The plurality of nozzle 235 is provided at a plurality of locations on the ring-shaped mold 230, for example, are provided at 12 locations every 30° in rotational symmetry.

The substrate processing device 200 according to the second embodiment of the present invention includes the mold moving mechanism 250 that moves the mold 230. The mold moving mechanism 250 includes a mold holding member 251 and a pin 253. In this embodiment, the mold holding member 251 is connected to the outside of the vertical portion 230b of the mold 230 to hold the mold 230 in the substrate processing device 200. However, the present invention is not limited thereto, and the mold holding member 251 may be connected to the outside of the flat surface portion 230a of the mold 230 to hold the mold 230 in the substrate processing device 200. The mold holding member 251 is connected to the pin 253. The pin 253 can move the mold holding member 251 up and down with respect to the stage 110 in the vertical direction by a driving mechanism (not shown). The drive source may be, for example, hydraulic pressure or pneumatic pressure.

The substrate processing device 200 according to the second embodiment of the present invention includes the height detection mechanism 260 that detects the distance between the mold 230 and the semiconductor substrate 115. The height detection mechanism 260 according to this embodiment includes a fixing member 261 and a distance measuring device 263. The fixing member 261 fixes the distance measuring device 263 to the mold holding member 251. However, the present invention is not limited thereto, and the fixing member 261 may directly fix the distance measuring device 263 to the mold 230. With this configuration, the distance between the distance measuring device 263 and the mold 230 can be fixed. The distance measuring device 263 measures the distance between the distance measuring device 263 and the semiconductor substrate 115 mounted on the stage 110. The distance between the semiconductor substrate 115 and the mold 230 can be calculated by subtracting the distance between the distance measuring device 263 and the mold 230 from the measured value of the distance measuring device 263. The distance measuring device 263 may be, for example, an optical type sensor or a laser type sensor.

[Operation of the Substrate Processing Device According to the Second Embodiment]

The operation of the substrate processing device according to the second embodiment of the present invention will be described with reference to FIGS. 9 to 12. In FIGS. 9 to 12, the mold moving mechanism 250 and the height detecting mechanism 260 are omitted in order to more clearly show the relationship between the mold 230 and the semiconductor substrate 115. The flow chart showing the operation of the substrate processing device according to the second embodiment is the same except that the order of S3 and S4 is exchanged, and therefore the description will be given with reference to FIG. 2.

Figure 9:
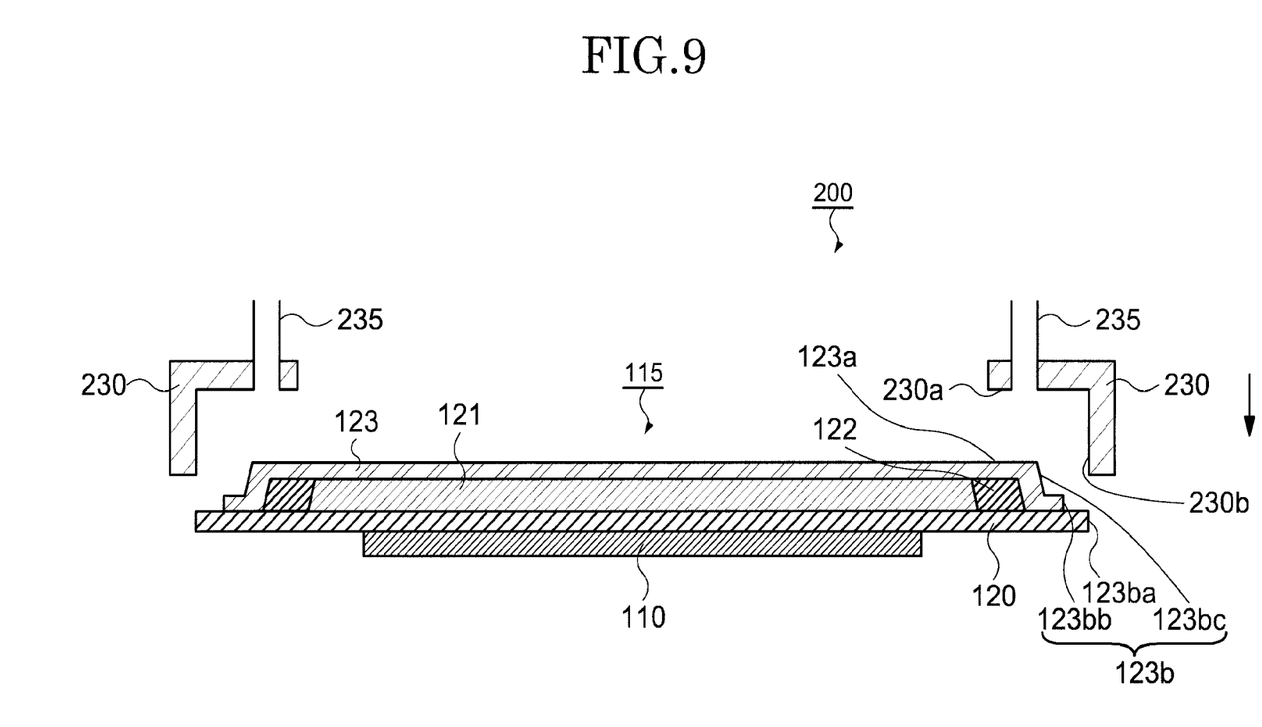
FIG. 9 is a cross-sectional view showing an operation of a substrate processing device according to the second embodiment.

As shown in FIG. 2, when the semiconductor substrate 115 is loaded into the substrate processing device 200 (FIG. 2 S1), the height detection mechanism 260 calculates the distance between the mold 230 and the semiconductor substrate 115 (FIG. 2 S2). The distance between the mold 230 and the semiconductor substrate 115 may be, for example, the distance between the flat surface portion 230a of the mold 230 and the upper surface 123a of the outer peripheral edge of the semiconductor substrate 115. As shown in FIG. 9, the mold moving mechanism 250 slightly lowers the mold 230 toward the semiconductor substrate 115. There is enough distance between the surface of the semiconductor substrate 115 and the flat surface portion 230a of the mold 230.

Figure 10:
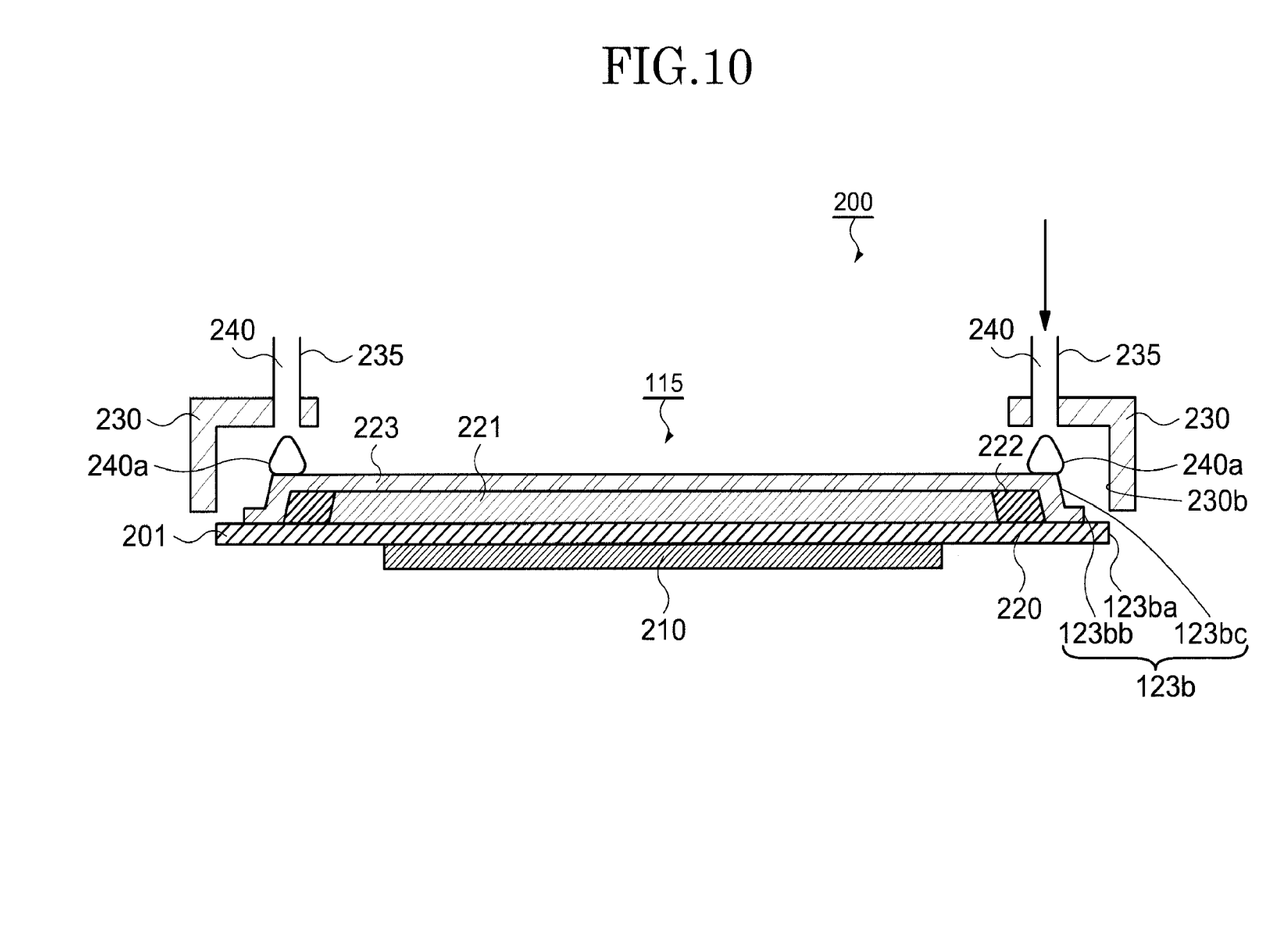
FIG. 10 is a cross-sectional view showing an operation of a substrate processing device according to the second embodiment.

As shown in FIG. 10, in this state, a thermosetting resist 240 is injected from the nozzle (FIG. 2 S4). A dropped thermosetting resist 240a is discretely located on the surface of the semiconductor substrate 115.

Figure 11:
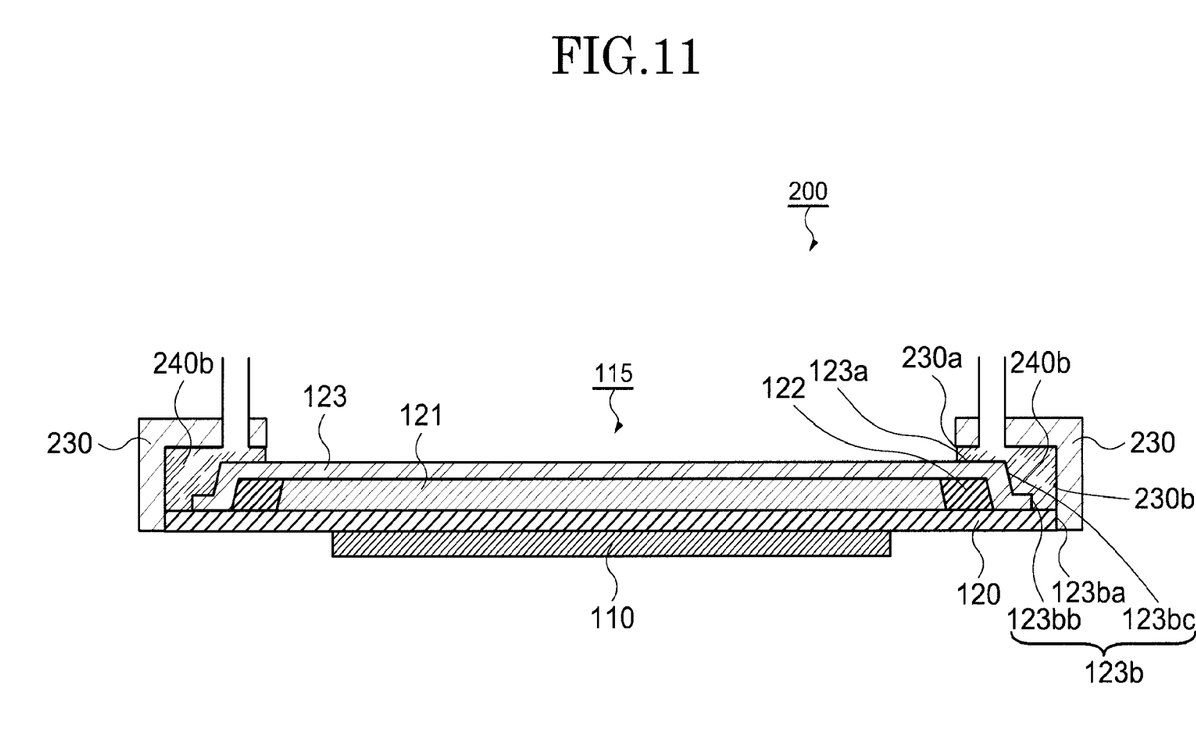
FIG. 11 is a cross-sectional view showing an operation of a substrate processing device according to the second embodiment.

Subsequently, as shown in FIG. 11, the mold moving mechanism 250 further lowers the mold 230 to the specified height toward the semiconductor substrate 115 (FIG. 2 S3). As a result, the upper surface 123a of the outer peripheral edge of the semiconductor substrate 115 and the flat surface portion 230a are closely faced each other, and the side surface 123b of the outer peripheral continuous with the upper surface 123a of the outer peripheral edge and the vertical portion 230b are closely faced each other. The positional relationship in this state is omitted here since it may be the same as that shown in FIG. 5. As a result of the mold 230 moving toward the semiconductor substrate 115 to a specified height, the thermosetting resist 240a is mushed and spreads on the upper surface of the outer peripheral edge of the semiconductor substrate 115.

Subsequently, the filled thermosetting resist 240a is cured (FIG. 2 S5). The stage 110 incorporates the heater which heats the thermosetting resist 240 to, for example, 130° C. to cure the resist 240, thereby forming a protection ring 240b of the outer peripheral edge.

Figure 12:
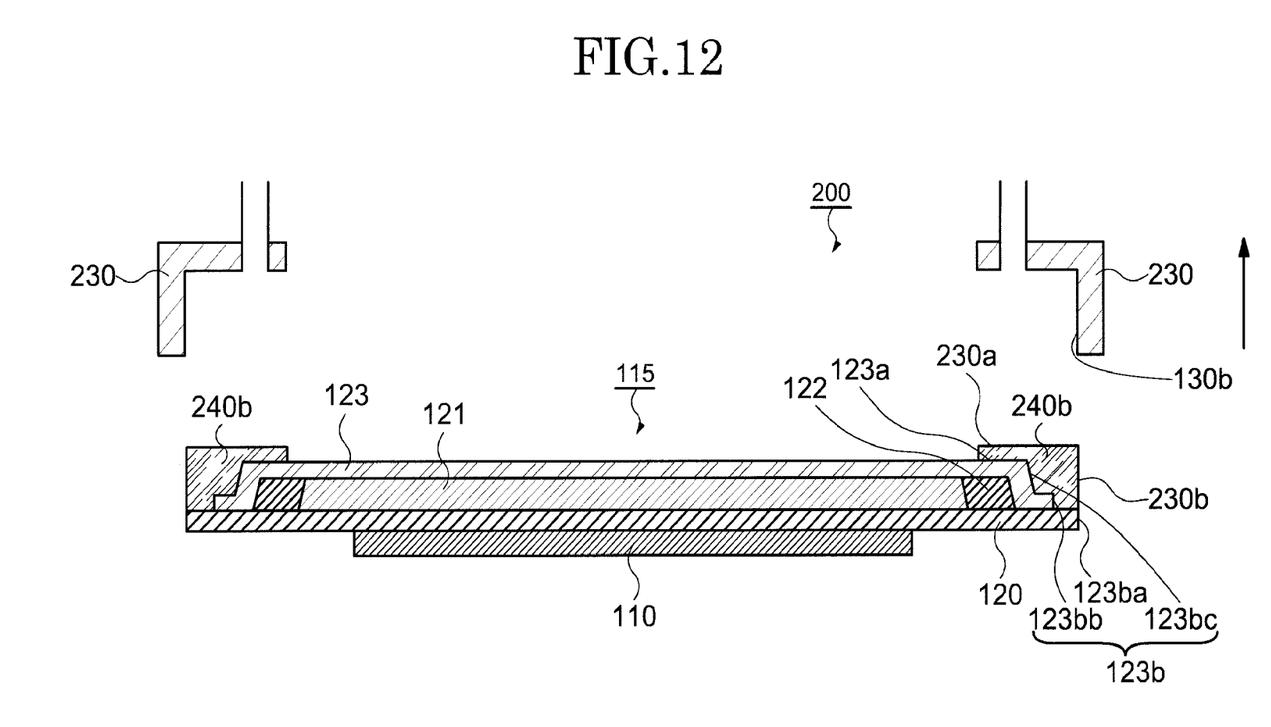
FIG. 12 is a cross-sectional view showing an operation of a substrate processing device according to the second embodiment.

Subsequently, as shown in FIG. 12, after forming the protection ring 240b of the outer peripheral edge on the semiconductor substrate 115, the mold 230 is raised by the mold moving mechanism 250 (FIG. 2 S6). The semiconductor substrate 115 is then ejected from the substrate processing device 200 (FIG. 2 S7).

[Method of Manufacturing a Semiconductor Device Using the Substrate Processing Device According to the Second Embodiment]

The method of manufacturing the semiconductor device using the substrate processing device according to the second embodiment is also as described above. First, prepare the semiconductor substrate 115 with a step in the outer peripheral edge (the step formed in the hard mask 123). Then, the thermosetting resist 240 is dropped onto the outer peripheral edge of the semiconductor substrate 115. This is covered with the mold 230 so that the upper surface 123a of the outer peripheral edge of the semiconductor substrate 115 and the flat surface portion 230a closely faced, and the side surface 123b of the outer peripheral continuous to the upper surface 123a of the outer peripheral edge and the vertical portion 230b are closely faced each other. Then, the thermosetting resist 240a is cured by the heater to form the protection ring 240b of the outer peripheral edge on the semiconductor substrate 115.

Subsequently, the resist material is applied on the hard mask 123. Next, the resist is selectively irradiated with UV rays or other energies by the exposure device to form the resist pattern. Further, the memory hole or the like is processed using the formed resist pattern as the mask.

In this way, even when etching a thin film having a large step on the semiconductor substrate, thinning (thinned film) does not occur due to the presence of the protection ring 240b of the outer peripheral edge. Therefore, the resist is not penetrated by the reactive ion etching process, and the substrate is not damaged by the subsequent wet etching process.

Modifications of the Embodiments of the Present Invention

In the above description, the substrate processing device used in forming the three-dimensional stacked layer type semiconductor memory on the silicon single crystal substrate 120 has been described as an example, the present invention is not limited thereto, for example, it may be applied to the substrate processing device used in the production of various devices requiring protection of the outer periphery of the substrate (a logic semiconductor device, an individual semiconductor device, etc.). The shape of the substrate is not limited to a circular shape, for example, it may be a rectangular shape as long as it is a display substrate or the like.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:
1. A substrate processing device comprising:
a stage configured to mount a substrate;
a mold having a first surface facing an upper surface of an outer peripheral edge of the substrate and a second surface facing a side surface of an outer peripheral continuous with the upper surface of the outer peripheral edge;

a mold moving mechanism configured to move the mold to bring the first surface close to the upper surface of the outer peripheral edge of the substrate and the second surface close to the side surface of the outer peripheral of the substrate; and a nozzle arranged in the mold, wherein the nozzle ejects resist, the mold is ring-shaped, and a plurality of the nozzles are provided in rotational symmetry.

2. The substrate processing device according to claim 1, further comprising:

a height detection mechanism configured to calculate a distance between the mold and the substrate.

3. The substrate processing device according to claim 1, wherein the stage has a heater configured to cure the resist.

4. The substrate processing device according to claim 1, wherein the nozzle is arranged in a connection region of the first surface and the second surface of the mold.

5. The substrate processing device according to claim 1, wherein the nozzle is arranged on the first surface of the mold.

6. The substrate processing device according to claim 1, wherein the mold comprises a ring-shaped flat portion including the first surface and a ring-shaped vertical portion including the second surface.

7. A method of manufacturing a semiconductor device using the substrate processing device according to claim 4, comprising:

mounting the substrate on the stage, moving the mold to a position where the first surface close to the upper surface of the outer peripheral edge of the substrate and the second surface close to the side surface of the outer peripheral of the substrate;

filling the resist between the mold and the substrate through the nozzle; and curing the resist.

8. The method of manufacturing the semiconductor device according to claim 7, further comprising:

calculating a distance between the mold and the substrate using a height detection mechanism.

9. A method of manufacturing a semiconductor device using the substrate processing device according to claim 5, comprising:

mounting the substrate on the stage, dropping the resist on the outer peripheral edge of the substrate through the nozzle;

moving the mold to a position where the first surface close to the upper surface of the outer peripheral edge of the substrate and the second surface close to the side surface of the outer peripheral of the substrate; and curing the resist.

10. The method of manufacturing the semiconductor device according to claim 9, wherein moving the mold causes the resist to spread on the upper surface the outer peripheral edge of the substrate.

11. The method of manufacturing the semiconductor device according to claim 9, further comprising calculating a height detection mechanism configured to calculates a distance between the mold and the substrate using a height detection mechanism, wherein moving the mold comprises calculating a distance between the upper surface of the outer peripheral edge of the substrate and the first surface.

* * * * *